United States Patent [19]
Lewis et al.

[11] Patent Number: 5,210,763
[45] Date of Patent: May 11, 1993

[54] OSCILLATOR

[75] Inventors: Meirion F. Lewis; David R. Wight, both of Worcs, England

[73] Assignee: State for Defence in Her Britannic Majecty's Government of the United Kingdom of Great Britain and Northern Ireland, The A Corp. of Britain, London

[21] Appl. No.: 855,031

[22] PCT Filed: Oct. 5, 1990

[86] PCT No.: PCT/GB90/01539

§ 371 Date: May 6, 1992

§ 102(e) Date: May 6, 1992

[87] PCT Pub. No.: WO91/05403

PCT Pub. Date: Apr. 18, 1991

[30] Foreign Application Priority Data

Oct. 9, 1989 [GB] United Kingdom ............. 8922681.5

[51] Int. Cl.$^5$ ................................................ H01S 3/10
[52] U.S. Cl. ........................................ 372/26; 331/135
[58] Field of Search ............... 372/26, 28, 32; 331/16, 331/29, 135, 155, 167, 187, DIG. 3

[56] References Cited

U.S. PATENT DOCUMENTS 3,333,212  7/1967  Vasseur et al. ............... 331/107
3,401,357  9/1968  D'Asaro ........................ 332/7.51
4,297,656 10/1981  Pan .............................. 331/135
4,345,482  8/1982  Adolfsson et al. ............ 331/155

OTHER PUBLICATIONS

Electronics Letters, vol. 22, No. 19, Sep. 19, 1986 (Stevenage, GB) M. F. Lewis et al "Novel Narrowband Fibre-Optice Microwave Filter" pp. 1016–1017.
Patent Abstract of Japan, vol. 9, No. 240 (E-345) (1963), Sep. 26, 1985 & JP, A, 6090443 (Fujikura Densen K.K.), May 21, 1985.
Patent Abstract of Japan, vol. 12, No. 135 (E-604), Apr. 23, 1988 & JP, A, 62258528 (NEC Corp.), Nov. 11, 1987.
International Search Report.

Primary Examiner—John D. Lee
Assistant Examiner—Robert E. Wise
Attorney, Agent, or Firm—Nixon & Vanderhye

[57] ABSTRACT

A single frequency oscillator (10) comprises a laser diode (12), a fibre optic bundle (22) acting as a delay line filter, a photodiode (26) and a feedback loop to the laser diode (12) containing an amplifier (28) and additional low Q filtering (29, 34). The laser diode output (18) bears a modulation signal which is filtered to a series of "resonant" or synchronous frequencies by the bundle (22), converted back to an electrical signal by the diode (26) amplified, and reduced to a single resonant frequency by the low Q filtering (29, 34). It is then applied to the laser diode (12) as positive feedback to modulate the diode output (18). The output of the oscillator (10) can be taken as a microwave signal or on an optical carrier. The invention provides an oscillator incorporating feedback on an optical carrier.

7 Claims, 3 Drawing Sheets

OSCILLATOR

The invention relates to a single frequency oscillator, and more particularly, although not exclusively, to one that may operate at high frequencies.

An oscillator is an electric circuit arranged such that electrical oscillations occur freely, and either at one frequency, or at a frequency which is tunable over a band of frequencies. Oscillators of various kinds are well known. They include, for example, oscillators incorporating tuned electrical circuits, quartz crystals and surface acoustic wave (SAW) devices operative at modest frequencies. Gunn diodes, klystrons and magnetrons are known for use at microwave frequencies and lasers for use at optical frequencies.

Of those oscillators that operate at microwave frequencies, klystrons and magnetrons are physically large and operate at high voltages and/or powers; Gunn diodes are small, operate at low power but are relatively unstable. In addition, it is difficult to produce feedback elements for use in these devices with Q values greater than $10^4$. A further problem is that, for an electrical oscillator to operate at radio frequency (RF), each electrical component is required to operate at RF, which at best proves expensive. There is therefore a need for physically small, electrically stable, high Q, preferably low cost oscillators to operate at high frequencies.

Oscillators producing multiple frequencies are also known in the prior art. One such is disclosed in U.S. Pat. No. 4,297,656. It employs a circuit which is part electrical and part optical, the latter incorporating a fibre optic delay line filter. It is unsuitable for single frequency operation.

The present invention provides an oscillator for generating an operating frequency, and comprising a light source, means for modulating the light source output at the operating frequency, and a feedback loop responsive to the light modulation and arranged to provide positive feedback to the modulating means, characterised in that the feedback loop includes:

a) optical delay line filtering means having a plurality of optical fibr with differing lengths arranged to define a fundamental frequency and associated harmonic frequencies, b) secondary filtering means arranged to select one of the fundamental and harmonic frequencies to be the operating frequency of the oscillator.

The invention has a relatively small number of electrical components that are required to operate at high frequency, since it at least partially consists of optical components. In addition it is potentially capable of high stability and operation over a wide range of frequencies with appropriate components. The frequency range may extend to the microwave region. The delay line filtering means may be arranged to provide a Q factor in the region of $10^6$.

The delay line filtering means may be a single fibre optic filter, or alternatively it may consist of first and second fibre optic filters in series. In the latter case, light output from the first filter is coupled to the second filter such that light from each fibre of the first filter illuminates each fibre of the second filter. The effect of the two filters is therefore multiplicative.

The light source output may be modulated by means of positive feedback to an electrical power supply to the light source. Alternatively, the light source may be modulated by an electro-optic modulator located between the light source and the delay line filtering means. In this case, the modulator receives positive feedback from the feedback loop.

The light source may be a laser diode.

The feedback loop may include a photodiode which is responsive to the light modulation.

The oscillator may include optical means for directing an output light beam modulated at the operating frequency to remote receiving means.

In order that the invention might be more fully understood, embodiments thereof will now be described, with reference to the accompanying drawings, in which.

Figure 1:
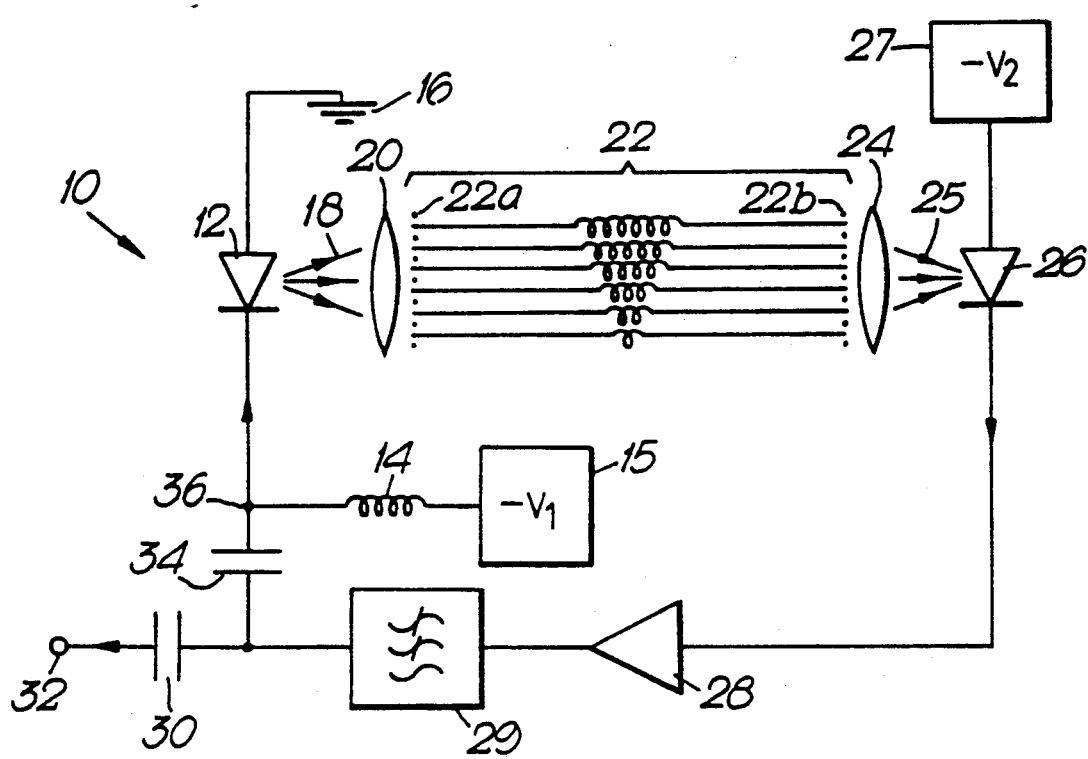
FIG. 1 is a schematic drawing of an oscillator of the invention.
Figure 2:
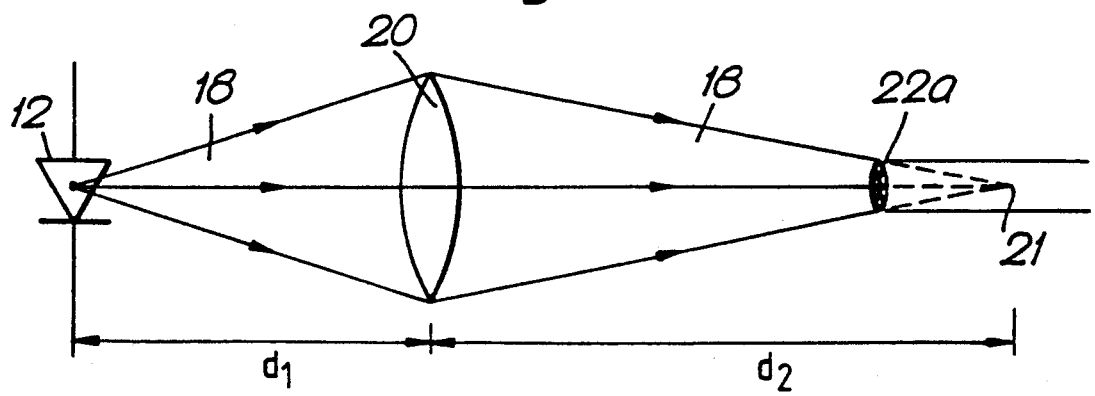
FIG. 2 is a schematic view of optical coupling between a laser diode and a fibre optic bundle used in the oscillator of FIG. 1.

Referring to FIGS. 1 and 2, an optical microwave oscillator 10 of the invention is shown schematically. The oscillator is in the form of a closed loop circuit 10. Part of the circuit 10 is optical and part is electrical. It incorporates a laser diode 12 and an inductor 14, which are connected in series between a negative bias voltage supply 15 and an earth point 16. The laser diode is forward biased.

Light 18 emitted by the laser diode 12 is incident on a lens 20. The lens-diode spacing $d_1$ is greater than the lens focal length. An image 21 of the laser diode 12 is formed at a distance $d_2$ from the lens 20, $d_2$ being greater than the lens focal length. Light passes from the lens 20 to a fibre optic bundle 22 having input and output ends 22a and 22b represented by dotted lines. The bundle 22 is positioned so that the input end 22a is fully illuminated, the fibres of the bundle 22 receiving similar (ideally equal) light intensities.

The fibre optic bundle 22 consists of seven multimode fibres having different lengths, but a constant incremental length. Thus the length $L_m$ of the mth fibre is given by $$L_m = L_1 + (m-1)L \quad (1)$$

where $L_1$ is the length of the shortest fibre (m=1) and L is the increment length. The bundle 22 acts as a delay line filter, the operation of which is described later.

Light passes along the fibres of the bundle 22 to the output end 22b where the ends of all the fibres are in the same plane. Light subsequently emerges from the fibres and is incident on a second lens 24. The lens 24 images light output from the bundle 22 on to a photodiode 26. The photodiode 26 is connected to a negative voltage supply 27 for reverse biasing purposes, and is connected in series with an amplifier 28 and a low pass filter 29. The amplifier 28 is connected via a coupling capacitor 30 to an oscillator output 32, and via a feedback capacitor 34 to a point 36 common to the inductor 14 and laser diode 12.

The electrical part of the loop circuit 10 comprises the photodiode 26 around to and including the laser diode 12. Components in the electrical part of the circuit 10 are connected together by conducting wires. The optical part of the circuit comprises from the laser diode 12 to the photodiode 26. The part of the closed loop circuit 10 from the laser diode output 18 round to the point 36 will be referred to as a feedback loop The fibre optic bundle 22 acts as a delay line filter in the following way. In normal operation of the oscillator 10, light output from the laser diode 12 carries a signal in the form of RF modulation. Light 18 emitted by the laser diode 12 passes into the fibres of the bundle 22 via the lens 20. The RF signal carried on the light 18 enters the fibres substantially in phase. As previously mentioned, the fibres have different lengths $L_m$. The delay in the mth fibre, $t_m$, is related to the length of the fibre by $L_m = ct_m$, where c is the velocity of light in the fibre. This velocity is lower than the velocity of light in free space due to the effective refractive index of the fibre, typically n=1.5. The delays, $t_m$, are given by $$t_m = t_1 + (m-1)t \qquad (2)$$

where $t_1$ is the delay along the shortest fibre of the bundle 22, and t is the incremental delay. Light intensities output from the individual fibres of the bundle 22 are summed incoherently by the photodiode 26.

As set out in equation (2) the fibres differ in delay by multiples of t. In consequence the light modulation signals output from the different fibres are in phase at the radio frequencies $f_i$ for which t corresponds to an integral number of RF cycles, ie when f=i/t, where i is an integer, including zero. At other radio frequencies the modulation phases received by the photodiode 26 differ and the corresponding amplitudes are small or zero.

Figure 3:
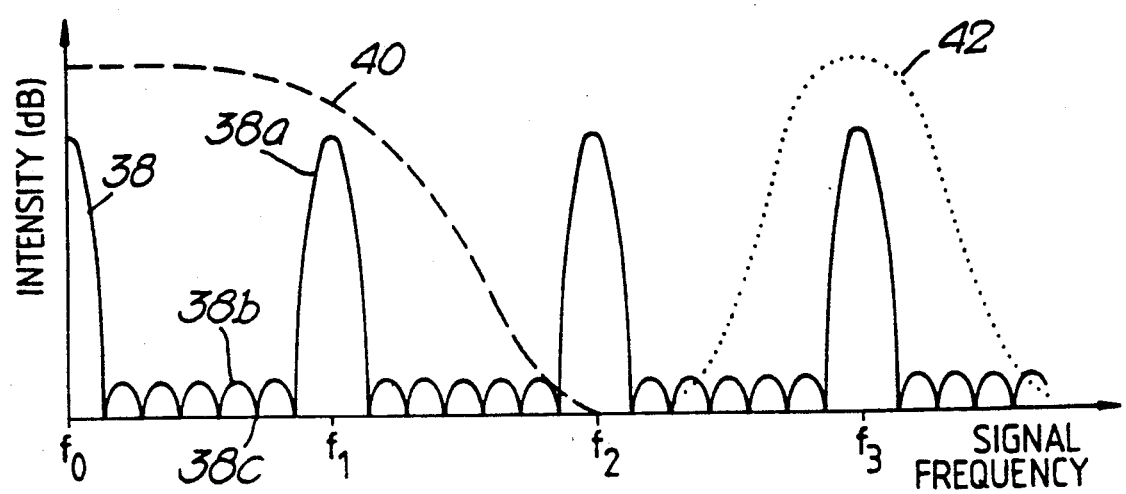
FIG. 3 is a graph of output signal intensity versus signal frequency, and shows curves for three different components of oscillators of the invention.

Referring now also to FIG. 3, three curves 38,40,42 graphically illustrate filter characteristics of the optical filter 22, low pass filter 29 and a band pass filter respectively. The fibre inputs to bundle 22, and thus outputs, are of substantially equal intensity and the overall variation of amplitude with frequency is substantially a repeated series of sinc functions. The solid curve 38 shows in part the variation of intensity with frequency of the fibre optic bundle 22. The curve 38 consists of a series of main lobes such as 38a with maxima at frequencies $f_0, f_1, f_2, f_3, \ldots$. The frequencies $f_i$ (i=0,1,2, ... ) are the "resonant" or synchronous frequencies of the bundle 22. $f_0$ is the DC component, $f_1$ is the fundamental frequency and higher resonant frequencies are harmonics. The resonant frequencies follow the relationship $f_i = if_1$. Between each pair of resonant frequencies $f_i$ and $f_{i+1}$ there are (M−2) submaxima, or sidelobes such as 38b, where M is the total number of fibres in the bundle 22. Between each mainlobe 38a and sidelobe 38b is a null, such as 38c. The separation between adjacent nulls is (1/Mt) except across the main lobes where it is (2/Mt).

Optical fibres generally exhibit very low attenuation and dispersion characteristics, consequently there are many more resonant frequencies $f_i$ than shown in FIG. 3. The bundle 22 therefore passes a DC signal and a series of frequencies which are integer multiples of the fundamental frequency $f_1$, with weak components at other frequencies.

The oscillator 10 operates in the following way. When a forward bias voltage first applied to the laser diode 12 there is no feedback RF signal and hence no modulation of the diode emission. In consequence the light modulation is noise only. The light 18 passes via the lens 20, bundle 22 and second lens 24 to the photodiode 26. The photodiode 26 incoherently sums the intensities of the seven fibre outputs, which results in vector addition of the signals carried on the light 25. The output current of the photodiode 26 varies linearly with incident optical power, in the range of operation, and thus the light modulation signal is converted into an electrical signal at the same frequency with a DC offset.

The electrical signal passes to the amplifier 28 and low pass filter 29. The low pass filter 29 is arranged to have a frequency response which falls off above $f_1$, but below $f_2$. The chain curve 40 of FIG. 3 illustrates this response. The signal passed by the filter 29 therefore contains amplified DC and $f_1$ with negligible higher frequency components. The signal passes to the capacitors 30 and 34 which do not pass the DC component of the signal. The signal at the oscillator output 32 is therefore essentially at the desired frequency f close to or equal to $f_1$ with much weaker components at other frequencies.

The signal passed by the capacitor 34 is combined with the DC bias at the common point 36. The signal is isolated from DC bias supply 15 by the choke inductor 14. The signal is applied to the laser diode 12 as a feedback signal. The output power of the laser diode 12 varies linearly with input current in the range of operation, thus the feedback signal results in intensity modulation of the laser diode emission. The signal proceeds around the circuit 10 again and again being amplified and further filtered on each transit. In this way a strong stable oscillation at the desired frequency f is built up from noise.

A circuit such as the oscillator 10 will sustain stable oscillation at the required frequency $f_1$ provided two conditions are satisfied. Firstly the oscillator 10 should exhibit open loop gain exceeding unity, and secondly the recirculating waves should all be in phase, i.e. the loop phase shift should be an integral multiple of $2\pi$ radians. Another feature necessary to make such a device reliable is that it should not be capable of sustaining oscillation at other frequencies. These aspects are now discussed in more detail.

Firstly, for the oscillation described above to grow rather than decay there should be an open-loop gain of greater than unity. Once strong oscillations have developed, saturation effects set in, and gain around the closed loop circuit 10 drops essentially unity in the steady state of oscillation. The frequencies with the highest open-loop gain are those with peak filter responses $f_i$, so the required frequency of oscillation f should be made close to one value of $f_i$. A suitable amplifier is one which provides an open-loop gain of 3 to 6 dB at frequency f.

In order that a circuit of this kind may oscillate at frequency f (at or near a peak $f_i$ of the filter response), it is necessary for the overall loop phase shift, $\phi_{total}$, to equal an integer multiple of $2\pi$ radians at this frequency, i.e. $\phi_{total} = 2p\pi$ where p is an integer. $\phi_{total}$ may often be written in the form $$\phi_{total} = 2\pi f\tau + \phi_{aux} \qquad (3),$$

where $\tau$ is the substantially frequency independent group delay around the circuit 10, and $\phi_{aux}$ is the substantially frequency independent phase shift within the circuit 10; $\phi_{aux}$ might for example include a phase shift of $\pi$ radians if the amplifier 28 or photodiode 26 is inverting. Thus a necessary condition for sustained oscillation is $$\phi_{total} = 2\pi f \tau + \phi_{aux} = 2p\pi \quad (4),$$

The loop circuit 10 as constructed must satisfy the condition of equation (4) in order for the feedback to the laser diode 12 to be in phase. For example this may be achieved by fine adjustment of $\tau$ by means of altering the length of connecting conducting wires in the circuit 10, or alternatively by inserting a phase shifter into the circuit 10.

In order for the oscillator 10 to oscillate at the desired frequency f, and not at additional frequencies satisfying Eq (3) with different values of p, it is sufficient to ensure that such frequencies do not exhibit an open loop gain of unity or greater. In practice it is desirable that their open-loop gain be at least several dB below that of the desired frequency f, and preferably they should be suppressed by 10dB or more. This consideration restricts the value of $\tau$ allowable because the additional frequencies satisfying Eq 4 are separated fro the desired frequency f by integer multiples of $1/\tau$. The most important of the additional frequencies are those at $f \pm 1/\tau$, and these should be removed from the peak $f_1$ of the main lobe 38a, ideally to the sidelobes e.g. 38b or nulls e.g. 38c of the frequency response 38.

The group delay $\tau$ is given by $$\tau = t_e + (t_1 + t_M)/2 \quad (5)$$

where $t_e$ is the delay between the photodiode 26 and laser diode 12, $t_1$ is the delay in the shortest fibre in the bundle 22 and $t_M$ the delay in the longest, or Mth, fibre. The frequencies f' that satisfy equation (4) are separated from the desired frequency f by integer multiples of $(1/\tau)$, and the nulls (e.g. 38c) are separated from the maxima at frequencies $f_i$ by integer multiples of $(1/Mt)$ it may be shown that $\tau$ is suitable when the following relationship is satisfied, $$t_e + t_1 = [(M+1)t]/2 \quad (6)$$

That is, when equation 6 is satisfied the additional frequencies $f' = f \pm 1/\tau$ coincides with nulls adjacent to the main lobe 38a. Other additional frequencies f' fall away from the main lobes e.g. 38a of the response 38 and are therefore suppressed by at least 13dB relative to the response at the peaks $f_i$.

In practice it is not necessary to satisfy Eq 6 precisely. For most applications an adequate degree of suppression of additional frequencies f' may be obtained if $(t_e + t_1)$ lies between zero and about $(M+1)t$.

If the highest spectral purity is required of an oscillator, all additional frequencies f' satisfying Eq (4) should ideally be located at a null e.g. 38c of the filters response 38. The may be achieved in at least 2 ways. One method is to employ a very small value of $(t_1 + t_e)$ equal to $t/2$. In these circumstances it can be shown that all additional frequencies f' fall on nulls e.g. 38c. In a second method the fibre optic bundle 22 may be replaced by first and second fibre optic bundles of like construction arranged in series. Light leaving the first bundle is mixed and then focussed on the second bundle as described previously for the first. Thus each fibre in the second bundle receives a contribution from each fibre in the first bundle. The effect of the two bundles in series is multiplicative. This enables all additional frequencies f' to be located at nulls e.g. 38c.

Figure 4:
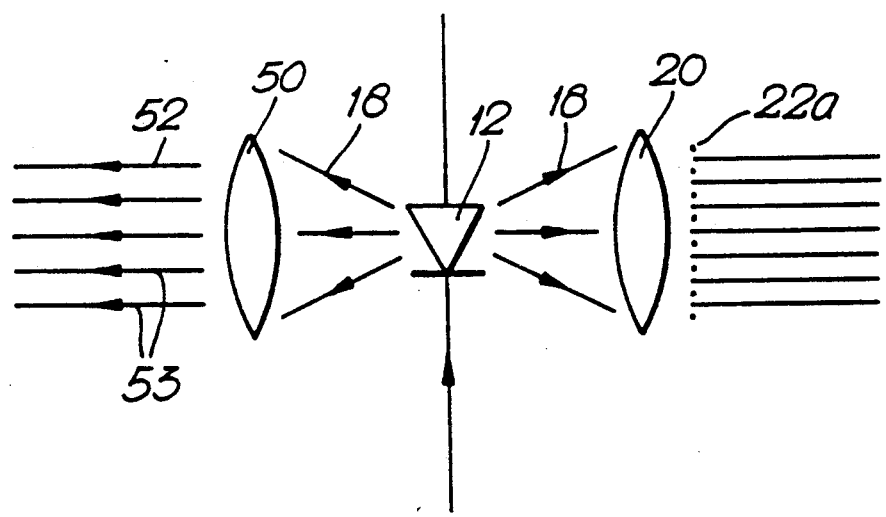
FIG. 4 is a schematic view of an alternative means of output from the oscillator of FIG. 1.

Referring now to FIG. 4, in which parts described earlier are like referenced, optical output coupling from the oscillator 10 is illustrated. In addition to its coupling to the fibre optic bundle 22, the laser diode 12 is optically coupled via a lens 50 to a beam 52 or a transmission line (not shown). RF modulated light indicated by arrows 53 is transmitted from the diode 12 to a distant receiver. The RF oscillator output may therefore be taken on an optical carrier 53 and transmitted optically to a remote location, either by propagation in free space or through a fibre.

Figure 5:
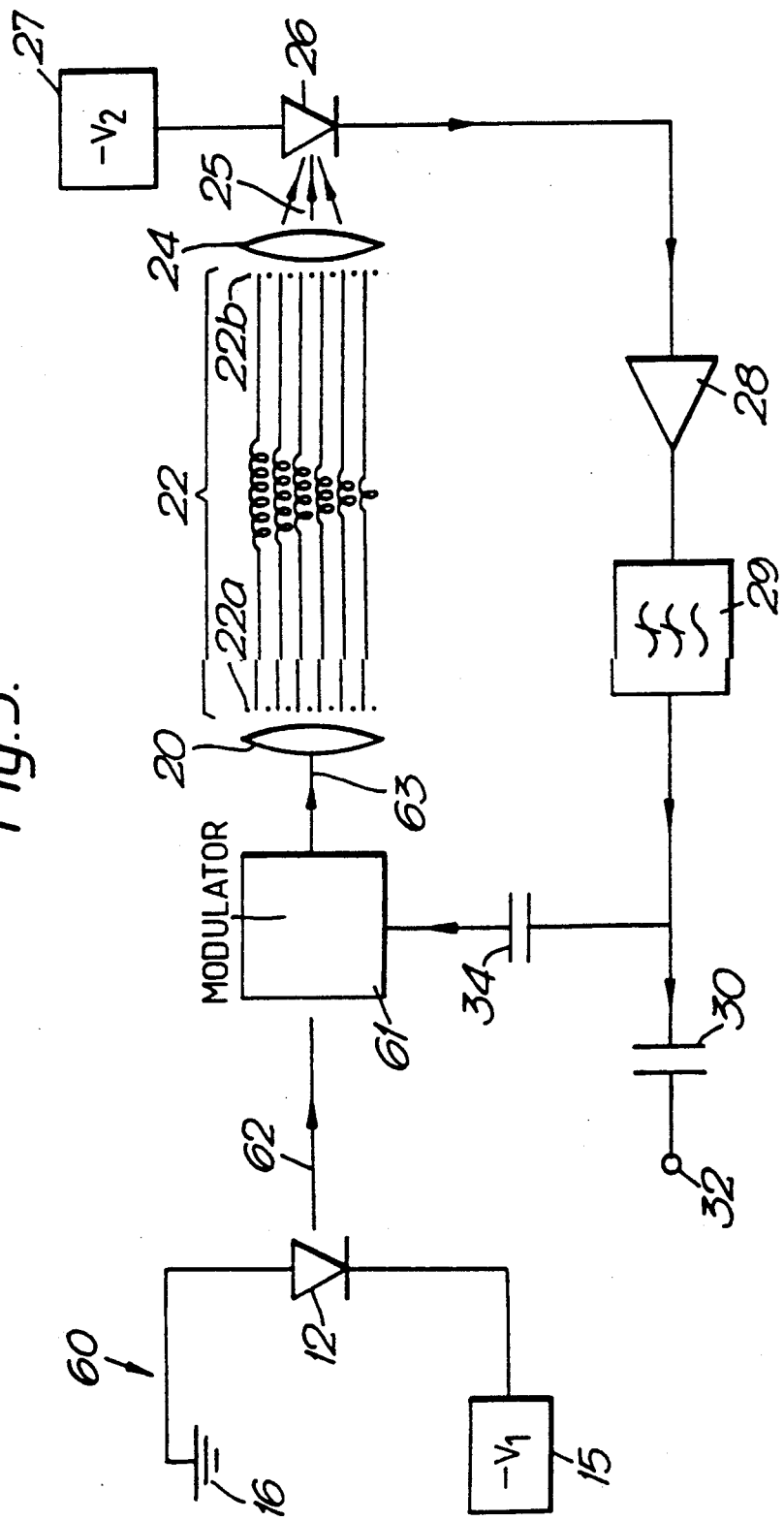
FIG. 5 shows an alternative form of oscillator of the invention.

Referring now to FIG. 5, a further embodiment 60 of the invention is shown schematically with parts common to other figures being like referenced. The device 60 is constructed and operates similarly to the device 10 described earlier and so the following description will concentrate on aspects of difference. The RF feedback signal from the filter 29 is connected not to the laser diode 12 but to an electro-optic modulator 61 positioned between the laser diode 12 and the first lens 20. The negative bias voltage supply 15 is connected directly to the diode 12. The laser diode 12 is operated continuously and light 62 output from it is unmodulated. The light 62 is incident on the modulator 61 to which the feedback signal is applied. The modulator 61 may be an integrated optic Mach-Zehnder interferometer structure. The modulator 61 produces an output light beam 63 which is modulated at the feedback frequency. The beam 63 passes to the lens 20 and the bundle 22 as in FIG. 1.

The modulator 61 may require less input RF power than is necessary to modulate the output of the laser diode 12 if the laser diode 12 is of high power. The amplifier 28 may therefore be omitted provided the circuit which remains exhibits a net gain of unity. For embodiments operative at high frequencies this may be particularly advantageous since high frequency amplifiers are very costly. In addition in embodiments operative at high frequencies it is often the amplifier 28 which limits the performance.

The oscillators 10 and 60 may incorporate a higher Q fibre optic filter. This is achieved by increasing the number of fibres in the bundle 22, thus reducing the frequency range covered by the main lobes. Alternatively, two or more fibre optic bundles may be used in series as described by M F Lewis and C L West, Electronics Letters Sep. 11, 1986, Vol 22 No 19, pp 1016-1017. For higher Q fibre optic filters the use of monomode fibres would be preferable.

An alternative form of fibre optic filter, suitable for use in place of the filter 22, is a recirculating filter. Such devices are known and various forms are described by J E Bowers et al, Electronics Letters Feb. 4th 1982, Vol 18 No 3, pp 110-111.

Alternative embodiments of the oscillators 10 and 60 may incorporate a band pass filter (not shown) replacing the low pass filter 29. In FIG. 3 a dotted curve 42 shows the form of frequency response of an appropriate band pass filter. The filter selects a harmonic frequency, in this example $f_3$, in preference to the fundamental frequency $f_1$. Consequently the oscillator operates at $f_3$. It should be noted that such filters require only a low Q, since for filters used in series the effect is multiplicative and the high Q element dominates.

Other alternative embodiments of the oscillators 10 and 60 may incorporate a varactor-tuned filter (not shown) replacing the low pass filter 29. The varactor capacitance and thus the pass band frequency of the filter varies with the varactor bias voltage. Therefore the resonant frequency $f_1$ chosen for operation of the oscillator can be varied.

The stability of the oscillators 10 and 60 is dominated by the high Q filter element 22. Higher Q filters lead to greater short term stability. Temperature stability depends on the temperature coefficients of expansion and of the refractive index of the materials employed to produce the optical elements. For typical optical fibres the overall temperature coefficient of delay is of the order of 10 parts per million per °C.

The foregoing examples of the invention are operative at 53 MHz using readily available electronic components. At this frequency fibres of the bundle 22 provide delays differing by multiples of 19 ns. The invention extends naturally to higher frequencies provided that the electronic components and fibres employed are suitable for those frequencies, and that the lengths of the fibres in the bundle 22 are appropriate.

We claim:

1. An oscillator for generating an operating frequency, and comprising a light source (12), means for modulating the light source output at the operating frequency, and a feedback loop responsive to the light modulation and arranged to provide positive feedback to the modulating means, characterised in that the feedback loop includes:
   a) optical delay line filtering means (22) having a plurality of optical fibres with differing lengths arranged to define a fundamental frequency and associated harmonic frequencies,
   b) secondary filtering means (29) arranged to select one of the fundamental and harmonic frequencies to be the operating frequency of the oscillator.

2. An oscillator according to claim 1 characterised in that the delay line filtering means (22) comprises two fibre optic delay line filters arranged in series.

3. An oscillator according to claim 1 characterised in that the means for modulating the light source output (18) comprises means for varying power supplied to the light source (12).

4. An oscillator according to claim 1 characterised in that the means for modulating the light source output comprises an electro-optic modulator (61) to which the feedback loop is connected.

5. An oscillator according to claim 1 characterised in that the light source is a laser diode (12).

6. An oscillator according to claim 1 characterised in that the feedback loop includes a photodiode (26) arranged to receive light from the optical delay line filtering means (22).

7. An oscillator according to claim 1 characterised in that it includes means (52) for directing modulated light (53) to remote receiving means.

* * * * *